(12) United States Patent
Yamakami et al.

(10) Patent No.: US 10,109,769 B2
(45) Date of Patent: Oct. 23, 2018

(54) LIGHT-EMITTING DEVICE

(71) Applicant: NICHIA CORPORATION, Anan-shi, Tokushima (JP)

(72) Inventors: Yuya Yamakami, Komatsushima (JP); Daisuke Morita, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 13 days.

(21) Appl. No.: 15/440,470

(22) Filed: Feb. 23, 2017

(65) Prior Publication Data

US 2017/0250312 A1    Aug. 31, 2017

(30) Foreign Application Priority Data

Feb. 25, 2016 (JP) .................................. 2016-033741

(51) Int. Cl.

| H01L 33/38 | (2010.01) |
|---|---|
| H01L 33/32 | (2010.01) |
| H01L 33/40 | (2010.01) |
| H01L 33/62 | (2010.01) |
| H01L 33/44 | (2010.01) |

(52) U.S. Cl.
CPC .............. *H01L 33/38* (2013.01); *H01L 33/44* (2013.01); *H01L 33/405* (2013.01)

(58) Field of Classification Search
CPC ....... H01L 33/38; H01L 33/62; H01L 33/405; H01L 33/60; H01L 2933/0016
See application file for complete search history.

(56) References Cited

U.S. PATENT DOCUMENTS

| 2006/0273335 | A1 | 12/2006 | Asahara et al. |
| 2012/0126259 | A1 | 5/2012 | Mizutani et al. |
| 2014/0061696 | A1 | 3/2014 | Akaike et al. |
| 2014/0225141 | A1 | 8/2014 | Katsuno et al. |
| 2015/0076550 | A1 | 3/2015 | Tanaka |
| 2015/0349220 | A1* | 12/2015 | Moon ................... H01L 33/405 257/98 |

(Continued)

FOREIGN PATENT DOCUMENTS

| JP | 2008-300719 A | 12/2008 |
| JP | 2012-114184 A | 6/2012 |
| JP | 2014-049603 A | 3/2014 |

(Continued)

*Primary Examiner* — David Spalla
(74) *Attorney, Agent, or Firm* — Foley & Lardner LLP

(57) ABSTRACT

A light-emitting device includes a semiconductor layered structure; a conductive substrate disposed below the semiconductor layered structure; one or more upper electrodes, each disposed on a portion of an upper surface of the semiconductor layered structure; a lower electrode disposed on a lower surface of the semiconductor layered structure in a region spaced apart from regions of the lower surface of the semiconductor layered structure directly under the upper electrodes, the lower electrode being electrically connected between the semiconductor layered structure and the substrate; and one or more conduction prevention portions, each disposed on the lower surface of the semiconductor layered structure in at least a region located between (i) a region directly under a respective one of the one or more upper electrodes and (ii) the region on which the lower electrode is disposed.

10 Claims, 3 Drawing Sheets

(56) References Cited

U.S. PATENT DOCUMENTS

2016/0049556 A1* 2/2016 Maute ................... H01L 33/405
                                                              257/98
2017/0194532 A1* 7/2017 Lin ....................... H01L 33/387

FOREIGN PATENT DOCUMENTS

| JP | 2014-154727 A | 8/2014 |
| JP | 2015-079953 A | 4/2015 |
| WO | WO-2006/006555 A1 | 1/2006 |

* cited by examiner

LIGHT-EMITTING DEVICE

CROSS-REFERENCE TO RELATED APPLICATION

This application claims priority to Japanese Patent Application No. 2016-033741, filed on Feb. 25, 2016, the disclosure of which is hereby incorporated by reference in its entirety.

BACKGROUND

The present disclosure relates to a light-emitting device.

International publication WO2006/006555 describes a light-emitting device including an electrode arranged on an upper side of a semiconductor light-emitting portion, a transparent electrode arranged on a lower side of the semiconductor light-emitting portion, a transparent insulating film arranged partially under the transparent electrode, and a reflective electrode arranged to be in contact with the transparent electrode and the transparent insulating film.

SUMMARY

With the light-emitting device described above, a portion of light is absorbed by the transparent electrode and the transparent insulating film, and it is therefore difficult to improve the light extraction efficiency. In view of this, an object of the present disclosure is providing a light-emitting device having a high light extraction efficiency.

A light-emitting device according to one embodiment of the present disclosure includes a semiconductor layered structure, a conductive substrate arranged under the semiconductor layered structure, one or more upper electrodes each arranged on a portion of an upper surface of the semiconductor layered structure; a lower electrode arranged on a lower surface of the semiconductor layered structure in a region spaced apart from regions of a lower surface of the semiconductor layered structure directly under the one or more the upper electrode, the lower electrode being electrically connected between the semiconductor layered structure and the substrate; and one or more conduction prevention portions each arranged on the lower surface of the semiconductor layered structure in a region including a region between a region directly under a respective one of the one or more upper electrodes and a region on which the lower electrode is arranged, the one or more conduction prevention portions configured to prevent electrical connection between the semiconductor layered structure and the substrate in an up-down direction. Each of the one or more conduction prevention portions includes a metal member having light reflectivity and arranged on the lower surface of the semiconductor layered structure, and an insulating member arranged on a lower surface of the metal member so as to prevent electrical connection between the semiconductor layered structure and the substrate in an up-down direction via the metal member.

With such a configuration, light from the semiconductor layered structure can be efficiently reflected by the metal member, thus realizing a light-emitting device having a high light extraction efficiency.

DETAILED DESCRIPTION OF EMBODIMENTS

First Embodiment

Figure 1:
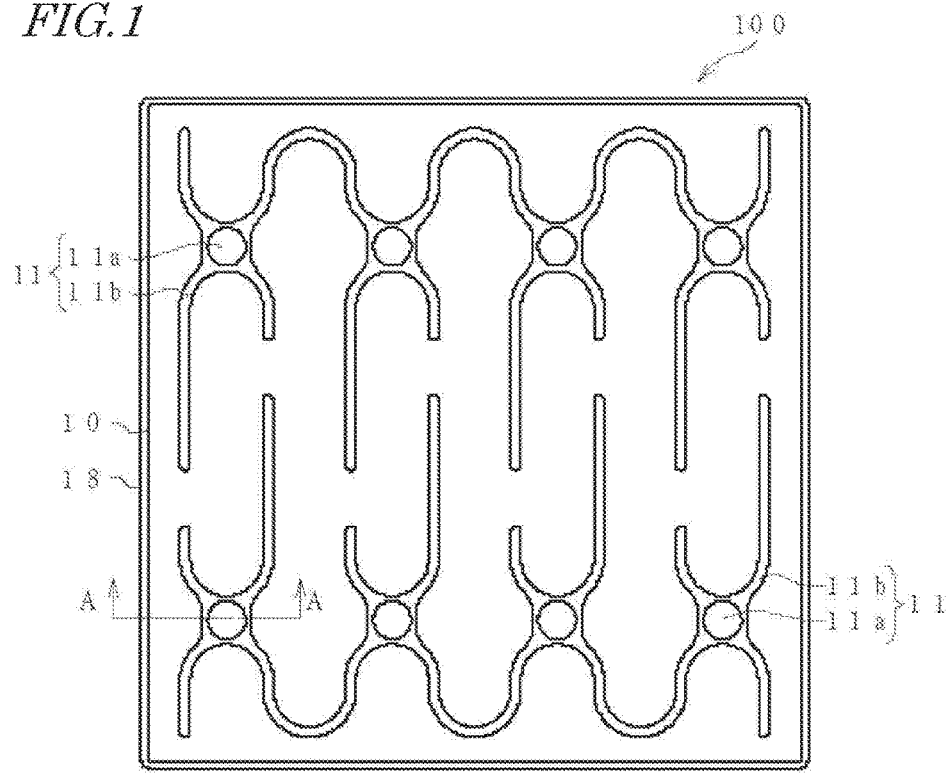
FIG. 1 is a top view schematically showing a structure of a light-emitting device according to a first embodiment.
Figure 2:
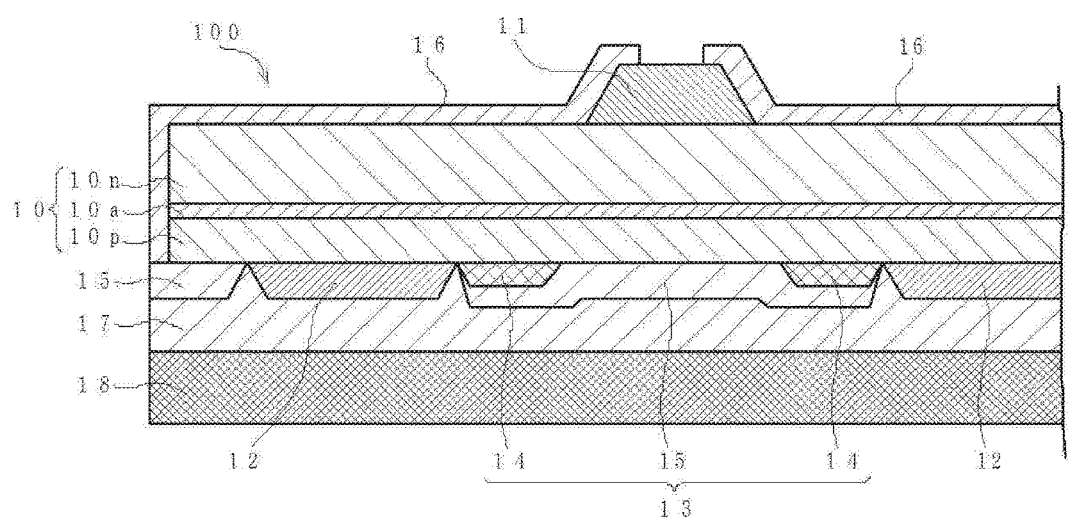
FIG. 2 is a partial cross-sectional view schematically showing a structure of the light-emitting device according to the first embodiment taken along line A-A of FIG. 1.
Figure 3:
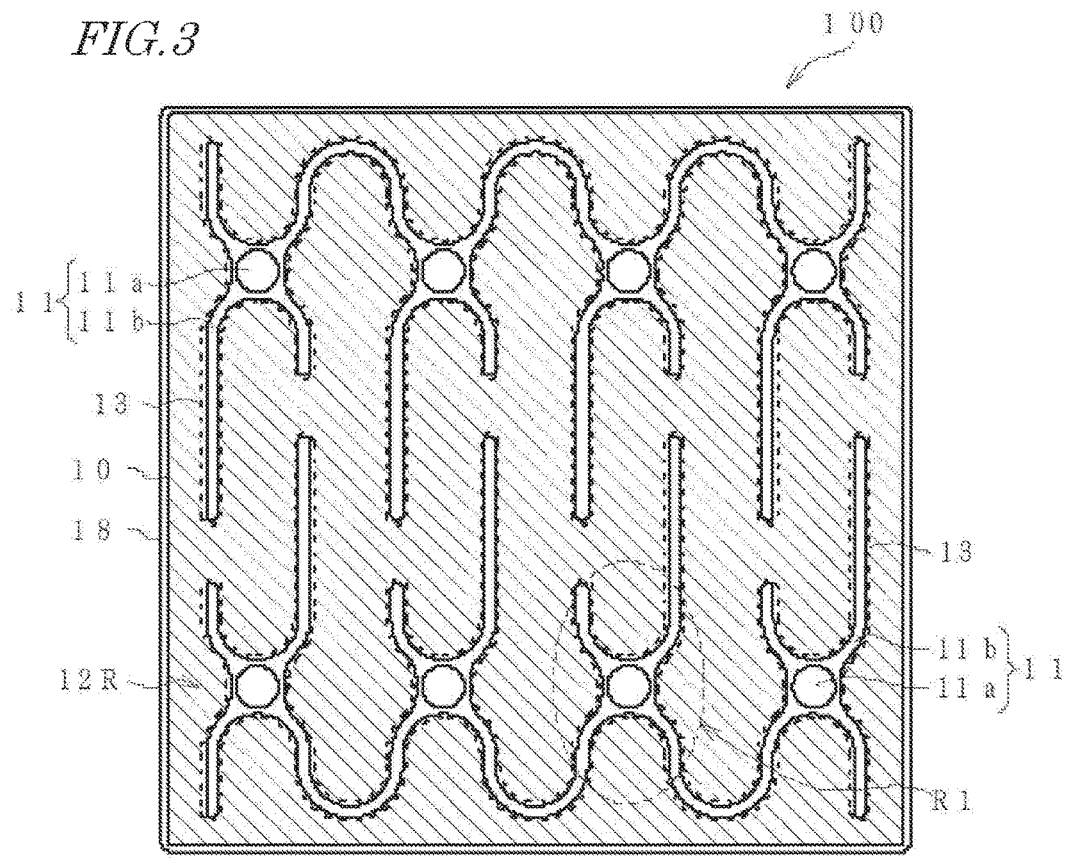
FIG. 3 is a top view schematically showing a structure of the light-emitting device according to the first embodiment.
Figure 4:
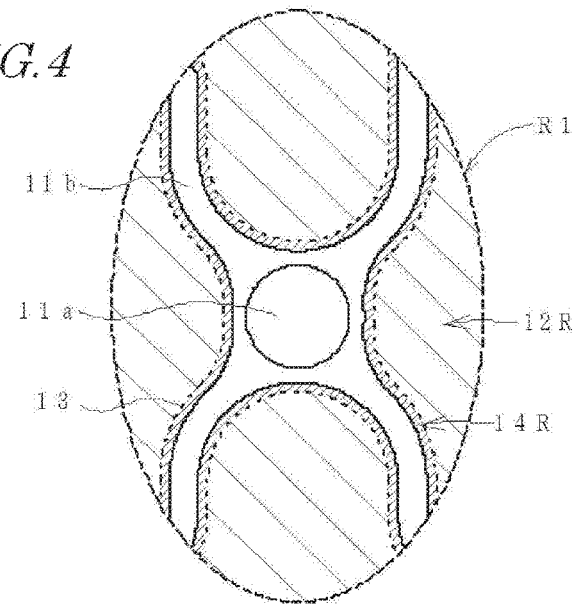
FIG. 4 a partially-enlarged top view schematically showing a structure of the light-emitting device according to the first embodiment in which a region R1 surrounded by a broken line in FIG. 3 is enlarged.
Figure 5:
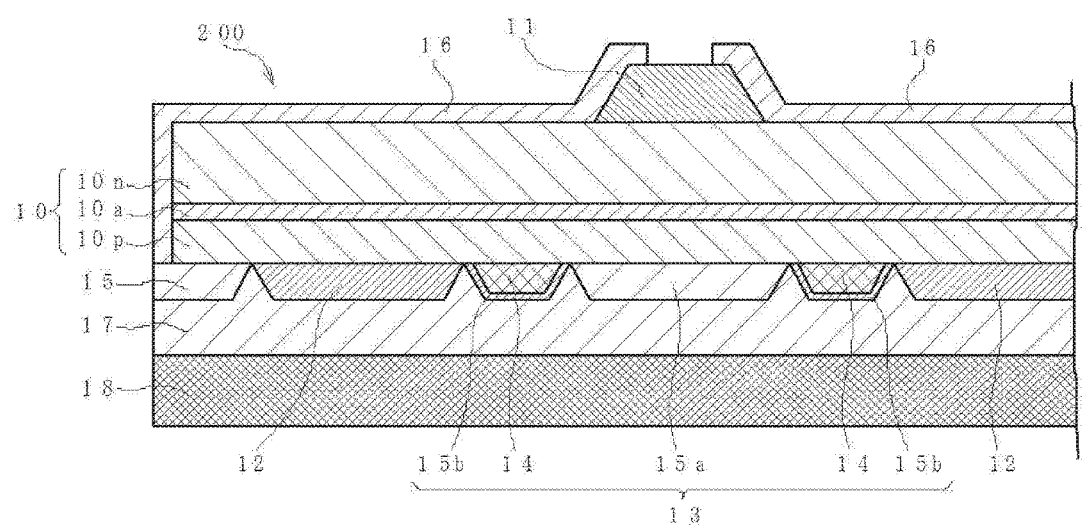
FIG. 5 is a partial cross-sectional view schematically showing a structure of a light-emitting device according to the second embodiment taken along line A-A of FIG. 1.

FIG. 1 shows a top view of a light-emitting device 100 according to the present embodiment. FIG. 2 is a partial cross-sectional view showing a structure of the light-emitting device 100. FIG. 3 is a top view showing the arrangement of members that are provided on an upper surface and a lower surface of a semiconductor layered structure 10 of the light-emitting device 100. FIG. 4 is a partially-enlarged top view showing a portion of the light-emitting device 100 to describe the arrangement of members that are provided on the upper surface and the lower surface of the semiconductor layered structure 10 of the light-emitting device 100. FIG. 5 is a partial cross-sectional view showing a configuration of a light-emitting device 200 according to the second embodiment. The hatched region in each of FIG. 3 and FIG. 4 indicates the region of a lower electrode 12 and metal members 14 in a top view, which are arranged on the lower surface of the semiconductor layered structure 10, and the hatched region does not indicate a cross section.

The light-emitting device 100 includes the semiconductor layered structure 10, and a conductive substrate 18 arranged under the semiconductor layered structure 10. The light-emitting device 100 further includes upper electrodes 11 arranged on a portion of the upper surface of the semiconductor layered structure 10, the lower electrode 12 being electrically connected between the semiconductor layered structure 10 and the substrate 18, the lower electrode 12 arranged on the lower surface of the semiconductor layered structure 10 in a region spaced apart from a region directly under the upper electrodes 11, and conduction prevention portions 13 arranged so as to prevent electrical connection between the semiconductor layered structure 10 and the substrate 18 in the up-down direction, the conduction prevention portion 13 being arranged in on the lower surface of the semiconductor layered structure 10 in a region including a region between the region directly under the upper electrodes 11 and the region where the lower electrode 12 is provided. Further, the conduction prevention portions 13 each includes a light-reflective metal member 14 arranged on the lower surface of the semiconductor layered structure 10, and an insulating member 15 arranged on the lower surface of the metal member 14 so as to prevent electrical connection between the semiconductor layered structure 10 and the substrate 18 in the up-down direction via the metal member 14.

With this arrangement, light from the semiconductor layered structure 10 can be more efficiently reflected by the metal member 14, so that the light extraction efficiency of the light-emitting device 100 can be improved. This will be discussed below.

In a light-emitting device including upper electrodes on an upper surface of the semiconductor layered structure and a lower electrode on a lower surface thereof, a current flow between the upper electrodes and the lower electrode that are on the semiconductor layered structure causes light-emission of the semiconductor layered structure. n such a case, electric current easily flow through a region connecting the upper electrodes and the lower electrode by the shortest distance, and light with high intensity tends to be emitted singly from such a region. In view of this, in the present embodiment, the lower electrode 12 is arranged on the lower surface of the semiconductor layered structure 10 in a region spaced apart from a region in the lower surface of the semiconductor layered structure 10 directly under the upper electrodes 11.

With this arrangement, in the semiconductor layered structure 10, not the regions directly under the upper electrodes 11 but the region between the upper electrodes 11 and the lower electrode 12 in a top view serves as a main current path. That is, in the present embodiment, current flow can easily be diffused across a wide area of the semiconductor layered structure 10, so that light-emitting region can be increased. In the semiconductor layered structure 10, in a top view, each of the regions between the upper electrodes 11 and the lower electrode 12 corresponds to a region that connects a respective one of the upper electrodes and the lower electrode by the shortest distance, and thus such a region tends to emit light of greater intensity as compared with other regions. In view of this, in the present embodiment, the light-reflective metal member 14 is arranged directly on the lower surface of the semiconductor layered structure 10 in a region that is located under a respective one of these regions. That is, no member is interposed between the semiconductor layered structure 10 and the metal member 14, which allows for efficient reflection of light from the semiconductor layered structure 10, so that light extraction efficiency of the light-emitting device can be improved.

Configuration of the light-emitting device 100 will now be described with reference to the drawings.

As shown in FIG. 2, the semiconductor layered structure 10 includes a p-side semiconductor layer 10p, an active layer 10a and an n-side semiconductor layer 10n layered in this order from a side of the substrate 18. In a top view, the semiconductor layered structure 10 has a substantially square shape with each side having a length of about 2 mm. For the n-side semiconductor layer 10n, the active layer 10a and the p-side semiconductor layer 10p, for example, a nitride semiconductor such as $In_xAl_yGa_{1-X-Y}N$ (0≤X, 0≤Y, X+Y<1) can be used.

As shown in FIG. 1 and FIG. 2, the upper electrodes 11 are arranged on a portion of the upper surface of the semiconductor layered structure 10, and is electrically connected to the n-side semiconductor layer 10n. That is, in the present embodiment, the upper electrodes 11 function as an n-electrode having a negative polarity.

The upper electrodes 11 each includes external connection portions 11a, and extension portion 11b extending from the external connection portion 11a. The external connection portions 11a serves as regions to be connected with an external member such as wires, and the extension portion 11b serves to diffuse current flow supplied to the external connection portion 11a over the upper surface of the semiconductor layered structure 10. As shown in FIG. 1, a plurality of external connection portions 11a are arranged on the upper surface of the semiconductor layered structure 10, and the extension portion 11b is disposed at each of the external connection portions 11a. For example, for the upper electrodes 11, a metal layer made of such as Ni, Au, W, Pt, Al, Rh or Ti, or a multi-layer structure in which these metals are layered.

The lower electrode 12 is disposed on a portion of the lower surface of the semiconductor layered structure 10, and is electrically connected to the p-side semiconductor layer 10p. That is, in the present embodiment, the lower electrode 12 functions as a p-electrode having a positive polarity. In FIG. 3, a first region 12R (hatched with upper-left to lower-right lines) is a region where the lower electrode 12 is provided. As can be understood from FIG. 3, the lower electrode 12 is provided on the lower surface of the semiconductor layered structure 10 in a region spaced apart from the regions directly under the upper electrodes 11. With this arrangement, the current easily flows through the semiconductor layered structure 10 in a region other than the regions directly under the upper electrodes 11, which allows current to flow across a wide region of the semiconductor layered structure 10, so that the light-emitting region of the light-emitting device 100 can be increased.

The lower electrode 12 reflects light from the semiconductor layered structure 10 toward the upper surface of the semiconductor layered structure 10 that serves as a main light extraction surface of the semiconductor layered structure 10, where the upper electrode 11 is arranged. With this arrangement, the light extraction efficiency of the light-emitting device 100 can be improved. For this reason, the lower electrode 12 is preferably made of a metal having a high reflectance, e.g., a metal such as Ag or Al, or an alloy whose main component is one or more of these metals.

As shown in FIG. 2, the conduction prevention portions 13 are each arranged on the lower surface of the semiconductor layered structure 10 in a region including the region between the regions directly under a respective one of the upper electrodes 11 and the region on which the lower electrode 12 is arranged. In other words, as shown in FIG. 3 and FIG. 4, the conduction prevention portions 13 are each arranged on the lower surface of the semiconductor layered structure 10 in a region that includes the region between a respective one of the upper electrodes 11 and the lower electrode 12 in a top view. The conduction prevention portions 13 each includes the light-reflective metal member 14 and the insulating member 15, and is arranged for preventing electrical connection between the semiconductor layered structure 10 and the substrate 18 in the up-down direction. Herein, electric current easily flows through the region on the semiconductor layered structure 10 between the upper electrodes 11 and the lower electrode 12 in a top view, and thus this region tends to emit light more intensely as compared with other regions. In view of this, the metal member 14 is arranged on the lower surface of the semiconductor layered structure 10, and the insulating member 15 is arranged under the metal members 14 and in the regions directly under the upper electrodes 11. With this arrangement, light from the semiconductor layered structure 10 can be efficiently reflected by the metal member 14 while current flow is diffused.

As shown in FIG. 2, the conduction prevention portions 13 each includes, on the lower surface of the semiconductor layered structure 10, portions directly under the upper electrodes 11 and portions between the regions directly under the upper electrodes 11 and the region on which the lower electrode 12 is arranged. As shown in FIG. 3 and FIG. 4, in a top view, each of the conduction prevention portions 13 has an area larger than an area of each of the upper electrodes 11. Herein, light from the semiconductor layered structure 10 in the regions directly under the upper electrodes 11 is easily reflected or absorbed by the upper electrodes 11, and thus is difficult to extract from the light-emitting device 100. In view of this, the conduction prevention portions 13 are arranged in the regions directly under the upper electrodes 11, so that the region other than the regions directly under the upper electrodes 11 serves as the main light-emitting region, which allows for improving light emission efficiency of the light emitting device 100.

The metal member 14 is arranged on the lower surface of the semiconductor layered structure 10, and the insulating member 15 is arranged on the lower surface of the metal member 14. In other words, the lower surface of the metal member 14, which is arranged on the lower surface of the semiconductor layered structure 10, is covered by the insulating member 15. Herein, in the case where each of the conduction prevention portions is made only of an insulating member made of such as $SiO_2$, the insulating member can reflect light from the semiconductor layered structure 10 that is incident upon the insulating member at a low angle, but cannot reflect light that is incident at a high angle. In the present embodiment, the metal member 14 is arranged on the lower surface of the semiconductor layered structure 10, and the lower surface of the metal member 14 is covered by the insulating member 15. With this arrangement, light can be reflected by the metal member 14 irrespective of the angle of incidence of light, while maintaining the insulation by the conduction prevention portion 13. Accordingly, light extraction efficiency can be improved. The expression "the lower surface of the metal member 14" refers to a portion of the metal member 14 other than a portion thereof that is in contact with the semiconductor layered structure 10. In order to improve the light extraction efficiency, the metal member 14 may be arranged on the entirety of a portion of the lower surface of the semiconductor layered structure 10 to be the conduction prevention portion 13.

The metal member 14 is arranged on the lower surface of the semiconductor layered structure 10 in a region between the region directly under a respective one of the upper electrodes 11 and the region on which the lower electrode 12 is arranged, and the insulating member 15 is arranged continuously on the lower surface of the semiconductor layered structure 10 in the region directly under a respective one of the upper electrodes 11 and the lower surface of the metal member 14. A second region 14R hatched with upper-right to lower-left lines in FIG. 4 is the region under which the metal member 14 is arranged. With this arrangement, electrical connection between the metal member 14 and the substrate 18 in the up-down direction can be prevented while maintaining the insulation of the semiconductor layered structure 10 in the region directly under a respective one of the upper electrodes 11. The insulating member 15 is preferably arranged continuously in the region directly under a respective one of the upper electrodes 11 and on the lower surface of the metal member 14. That is, with the insulating member 15 arranged as an integral piece both in the region directly under a respective one of the upper electrodes 11 and on the lower surface of the metal member 14, electric conduction between the semiconductor layered structure 10 and the substrate 18 can be prevented, which may otherwise be occurred via a space between the insulating members on the lower surface of the semiconductor layered structure 10 if insulating members are arranged separately in each of the regions directly under the upper electrodes 11 and on the metal member 14. Thus, it is possible to more reliably ensure the insulation by the conduction prevention portion 13. The size of the insulating member 15 is larger than the size of the region directly under a respective one of the upper electrodes 11. That is, the insulating member 15 is formed to be larger than a respective one of the upper electrodes 11 in a top view. The expression "the insulating member 15 is arranged as an integral piece" refers to that the insulating member 15 is formed as a single body in a single step.

As shown in FIG. 2, etc., it is preferred that the metal member 14 is arranged only on the lower surface of the semiconductor layered structure 10 in a region between the regions directly under the upper electrodes 11 and the region under which the lower electrode 12 is arranged. That is, it is preferable that the metal members 14 are not arranged in the regions directly under the upper electrode 11. With the metal member 14 arranged on the lower surface of the semiconductor layered structure 10 at an entirety of a region that is to be the conduction prevention portion 13, light extracting efficiency can be improved. However, in this arrangement, the area of the metal member 14 is increased, which may lead to high possibility of electrical connection in the up-down direction via the metal member 14. In view of this, with the metal member 14 arranged on the lower surface of the semiconductor layered structure 10 in a region between the regions directly under the upper electrodes 11 and the region where the lower electrode 12 is arranged, the metal member 14 is prevented from serving as a conduction portion. Accordingly, it is possible to improve the reliability of the light-emitting device 100 while improving the light extraction efficiency.

As shown in FIG. 3 and FIG. 4, in a top view, the conduction prevention portions 13 are each arranged in a region including the region directly under the external connection portion 11a of a respective one of the upper electrodes 11 and the region directly under the extension portion 11b of a respective one of the upper electrodes 11. With this arrangement, the region in which the above-described advantageous effect of the conduction prevention portions 13 is realized can be increased, and it is possible to reduce unevenness in the brightness on the light extraction surface of the light-emitting device 100.

For the metal member 14, a metal such as Al and Ag, or an alloy whose primary component is one or more of these metals is preferably used. With such a material, light can be reflected efficiently.

The metal member 14 preferably has a thickness of 0.2 μm or more, which is sufficient for reflecting light from the semiconductor layered structure 10. In order to reduce the manufacturing cost, the thickness of the metal member 14 is preferably 0.5 μm or less.

The insulating member 15 is arranged so as to prevent electrical connection between the semiconductor layered structure 10 and the substrate 18 in the up-down direction via the metal member 14. That is, the insulating member 15 is arranged so that, in the lower surface of the semiconductor layered structure 10, the region on which the metal member 14 is arranged does not serve as a region through which the semiconductor layered structure 10 is electrically connected to the substrate 18.

In view of the insulation, examples of the material of the insulating member 15 include $SiO_2$, SiON and SiN.

For ensuring insulation, the insulating member 15 preferably has a thickness of 0.05 μm or more and is more preferably 0.1 μm or more. In order to reduce the manufacturing cost, the insulating member 15 preferably has a thickness of 1 μm or less and more preferably 0.5 μm or less.

A protective film 16 is arranged to cover substantially an entirety of upper surfaces and lateral surfaces of the semiconductor layered structure 10 and the upper electrode 11, and functions to protect the light-emitting device 100. In order to secure connection to external members, the protective film 16 is not arranged on a portion of the external connection portion 11*a*, and a conductive wire, or the like, is bonded to this portion for the electrical connection with an external power supply. For the protective film 16, similar material as the insulating member 15 as described above can be used. In the present embodiment, $SiO_2$ is used for the protective film 16.

A bonding member 17 is arranged between the semiconductor layered structure 10 and the substrate 18 for bonding these members together. The lower electrode 12, which is arranged on the semiconductor layered structure 10, is electrically connected to the substrate 18 via the bonding member 17. The bonding member 17 is arranged between substantially the entirety of the lower surface of the semiconductor layered structure 10 and the upper surface of the substrate 18, and bonds the semiconductor layered structure 10 and the substrate 18 together. Therefore, in the case where the conduction prevention portions 13 are not arranged on the lower surface of the semiconductor layered structure 10, substantially the entirety of the lower surface of the semiconductor layered structure 10 serves as a conducting portion, and thus it is difficult to diffuse the current flow supplied to the upper electrodes 11 over a wide area. In the present embodiment, the conduction prevention portions 13 are arranged on the lower surface of the semiconductor layered structure 10 in the regions directly under the upper electrodes 11. With this arrangement, even if the semiconductor layered structure 10 and the substrate 18 are electrically connected together using the conductive bonding member 17, current flow can be diffused over a wide region of the semiconductor layered structure 10, the light-emitting region of the light-emitting device 100 can be increased. In view of bonding strength and conductivity, for the bonding member 17, a solder material whose main component is AuSn, NiSn, AgSn, or the like, for example, is preferably used.

The substrate 18 is electrically conductive and is arranged under the semiconductor layered structure 10. For the substrate 18, for example, CuW, Si or Mo, can be used.

Second Embodiment

A light-emitting device 200 according to the present embodiment will be described with reference to FIG. 5.

The light-emitting device 200 is different from the first embodiment in the configuration of the metal member 14 and the insulating member 15 of the conduction prevention portions 13 arranged on the lower surface of the semiconductor layered structure 10. Other configurations are similar to that in the first embodiment.

As shown in FIG. 5, each of the metal member 14 is arranged on the lower surface of the semiconductor layered structure 10 at a location between the region directly under a respective one of the upper electrodes 11 and the region on which the lower electrode 12 is arranged. Moreover, a first insulating member 15*a* is arranged on the lower surface of the semiconductor layered structure 10 in the region directly under a respective one of the upper electrodes 11.

A second insulating member 15*b* is arranged on the lower surface of the metal member 14 so as to prevent electrical connection between the semiconductor layered structure 10 and the substrate 18 in the up-down direction via the metal member 14. That is, the lower surface of the semiconductor layered structure 10, each of the regions directly under the upper electrodes 11 are insulated from the substrate 18 by the first insulating member 15*a*, and the region on which the metal member 14 is arranged is insulated from the substrate 18 by the second insulating member 15*b* arranged on the lower surface of the metal member 14. The second insulating member 15*b* is arranged so as to prevent electrical connection between the semiconductor layered structure 10 and the substrate 18 in the up-down direction via a respective one of the metal members 14. With this configuration, a material suitable for respective ones of the regions directly under the upper electrodes 11 and the regions under each of which the metal member 14 is arranged can be selected, and can be arranged in the respective ones of these regions, so that insulation can be easily secured. With such a configuration, as in the first embodiment, it is possible to improve the light extraction efficiency of the light-emitting device 200.

Materials similar to those of the insulating member 15 in the first embodiment may be used for the first insulating member 15*a* and the second insulating member 15*b*. The first insulating member 15*a* and the second insulating member 15*b* may be made of the same material.

The second insulating member 15*b* is preferably formed of an oxide film whose primary component is a metal contained in each of the metal members 14. With this arrangement, adhesion between the metal member 14 and the second insulating member 15*b* can be improved, and the electrical connection between the metal member 14 and the substrate 18 can be stably prevented, so that reliability of the light-emitting device 200 can be improved. In the case where aluminum, for example, is used for the metal member 14, the second insulating member 15*b* is made of $Al_2O_3$ (aluminum oxide), which results from oxidation of the lower surface of the metal member 14. Because aluminum has a high reflectance and aluminum oxide has a good insulation, with this arrangement, the light extraction efficiency can be improved while the insulation of the lower surface of the semiconductor layered structure 10 in the region under which the metal member 14 is arranged.

While the first embodiment and the second embodiment have been described above, the scope of the present invention is not limited to these embodiments. Rather, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A light-emitting device comprising:
   a semiconductor layered structure;
   a conductive substrate disposed below the semiconductor layered structure;
   one or more upper electrodes, each disposed on a portion of an upper surface of the semiconductor layered structure;
   a lower electrode disposed on a lower surface of the semiconductor layered structure in a region spaced apart from regions of the lower surface of the semiconductor layered structure directly under the one or more upper electrodes, the lower electrode being electrically connected between the semiconductor layered structure and the substrate; and
   one or more conduction prevention portions, each disposed on the lower surface of the semiconductor layered structure in at least a region located between (i) a region directly under a respective one of the one or more upper electrodes and (ii) the region on which the lower electrode is disposed, wherein the one or more conduction prevention portions are configured to prevent electrical connection between the semiconductor layered structure and the substrate in an up-down direction, wherein each of the one or more conduction prevention portions includes:
- a metal member having light reflectivity and disposed on the lower surface of the semiconductor layered structure, and
- an insulating member disposed on a lower surface of the metal member so as to prevent electrical connection between the semiconductor layered structure and the substrate in an up-down direction via the metal member,
- wherein an entirety of the metal member is located outside of the regions of the lower surface of the semiconductor layered structure directly under the one or more upper electrodes.

2. The light-emitting device according to claim 1, wherein each of the one or more conduction prevention portions is also disposed on the lower surface of the semiconductor layered structure in the region directly under the respective one of the one or more upper electrodes.

3. The light-emitting device according to claim 1, wherein:
- each metal member is disposed on the lower surface of the semiconductor layered structure in said region between (i) the region directly under the respective one of the one or more upper electrode and (ii) the region on which the lower electrode is disposed; and
- each insulating member is disposed continuously on (i) the lower surface of the semiconductor layered structure in the region directly under the respective one of the one or more upper electrode and (ii) the lower surface of the metal member.

4. The light-emitting device according to claim 1, wherein each of the one or more metal members is made of aluminum or an alloy containing aluminum as a main component.

5. The light-emitting device according to claim 1, wherein each of the one or more metal members has a thickness of 0.2 µm or more.

6. The light-emitting device according to claim 1, further comprising a bonding member disposed between the semiconductor layered structure and the substrate, the bonding member being electrically connected between the lower electrode and the substrate.

7. The light-emitting device according to claim 2, further comprising a bonding member disposed between the semiconductor layered structure and the substrate, the bonding member being electrically connected between the lower electrode and the substrate.

8. The light-emitting device according to claim 6, wherein the bonding member contains AuSn, NiSn, or AgSn as a main component.

9. The light-emitting device according to claim 7, wherein the bonding member contains AuSn, NiSn, or AgSn as a main component.

10. The light-emitting device according to claim 1,
wherein each of the one or more upper electrodes includes external connection portions, and an extension portion extending from the external connection portions, and
wherein each of the one or more conduction prevention portions is disposed in a region including regions directly under the external connection portions and a region directly under the extension portion.

* * * * *